US009645190B2

United States Patent
Fukasawa et al.

(10) Patent No.: US 9,645,190 B2
(45) Date of Patent: May 9, 2017

(54) PARTIAL DISCHARGE SENSOR

(71) Applicants: Toru Fukasawa, Tokyo (JP); Takashi Ito, Tokyo (JP); Hiroaki Miyashita, Tokyo (JP)

(72) Inventors: Toru Fukasawa, Tokyo (JP); Takashi Ito, Tokyo (JP); Hiroaki Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 194 days.

(21) Appl. No.: 14/420,211

(22) PCT Filed: Nov. 7, 2012

(86) PCT No.: PCT/JP2012/078862
§ 371 (c)(1),
(2) Date: Feb. 6, 2015

(87) PCT Pub. No.: WO2014/073056
PCT Pub. Date: May 15, 2014

(65) Prior Publication Data
US 2015/0285852 A1    Oct. 8, 2015

(51) Int. Cl.
*G01R 31/16* (2006.01)
*G01R 31/12* (2006.01)

(52) U.S. Cl.
CPC ......... *G01R 31/16* (2013.01); *G01R 31/1254* (2013.01); *G01R 31/1272* (2013.01)

(58) Field of Classification Search
CPC ................. G01R 31/1272; G01R 31/1254
See application file for complete search history.

(56) References Cited

U.S. PATENT DOCUMENTS 6,333,715 B1    12/2001  Kato et al.
2005/0052329 A1  3/2005  Tsukamoto
(Continued)

FOREIGN PATENT DOCUMENTS

EP    0984289 A1    3/2000
GB    2444613 A     6/2008
(Continued)

OTHER PUBLICATIONS

The extended European search report issued by the European Patent Office on Jul. 6, 2016, which corresponds to European Patent Application No. 12887890.7-1568 and is related to U.S. Appl. No. 14/420,211.

(Continued)

*Primary Examiner* — Huy Q Phan
*Assistant Examiner* — Adam Clarke
(74) *Attorney, Agent, or Firm* — Studebaker & Brackett PC

(57) ABSTRACT

A partial discharge sensor includes: a first ground (1) that constitutes a closed space (3) to surround a high-voltage wire (2); and a cylindrical branch pipe (4) disposed at the first ground (1) to protrude to an outer space to house with a lid (8) a first metal container (6) having at least one hole through which gas can pass, and having a slit (12) formed on the side to the space (3); at one end of a coaxial wire (7) disposed in the container (6), an outer conductor (9) of the coaxial wire (7) is connected to the first metal container (6) at a portion near the center of the slit (12), and an inner conductor (10) of the coaxial wire (7) is connected to the first metal container (6) at an opposite portion to a position where the outer conductor (9) is connected across the slit (12).

11 Claims, 4 Drawing Sheets

(56) References Cited

U.S. PATENT DOCUMENTS

| | | | | |
|---|---|---|---|---|
| 2005/0134290 A1* | 6/2005 | Sarkozi | ............... | G01R 31/1272 |
| | | | | 324/543 |
| 2009/0027062 A1 | 1/2009 | Maruyama et al. | | |
| 2014/0002099 A1* | 1/2014 | Fukasawa | ........... | G01R 31/1272 |
| | | | | 324/537 |
| 2015/0015249 A1* | 1/2015 | Ausserlechner | ........ | G01R 15/20 |
| | | | | 324/252 |
| 2015/0346267 A1* | 12/2015 | Fukasawa | ............... | G01R 35/00 |
| | | | | 324/520 |

FOREIGN PATENT DOCUMENTS

| | | |
|---|---|---|
| JP | S56-159905 A | 12/1981 |
| JP | H03-082316 A | 4/1991 |
| JP | H03-164023 A | 7/1991 |
| JP | H04-004708 A | 1/1992 |
| JP | H10-170598 A | 6/1998 |
| JP | 2001-156533 A | 6/2001 |
| JP | 2004-271402 A | 9/2004 |
| JP | 2005-086531 A | 3/2005 |
| JP | 2008-278206 A | 11/2008 |
| JP | 2009-152684 A | 7/2009 |

OTHER PUBLICATIONS

International Search Report; PCT/JP2012/078862; Dec. 11, 2012.
Judd, Martin D. et al.; "A Pulsed GTEM System for UHF Sensor Calibration"; IEEE Transactions on Instrumentation and Measurement; vol. 47; No. 4; Aug. 1998; pp. 875-880.

* cited by examiner

PARTIAL DISCHARGE SENSOR

TECHNICAL FIELD

The present invention relates to a partial discharge sensor that detects a high frequency wave generated in a device in high power equipment such as a GIS (Gas Insulated Switchgear) to detect a partial discharge phenomenon.

BACKGROUND ART

As disclosed in Patent Document 1, for example, a partial discharge sensor in a conventional insulation diagnosis apparatus is configured such that outer and inner conductors of signal wires that are connected to a signal extracting port are connected to outer and inner electrodes. In addition, the partial discharge sensor is disposed in a casing connected through an opening; a gap is provided on the inner side of the inner electrode, and a desiccant is inserted into the corresponding part of the gap. With this configuration, a function as the partial discharge sensor and a function of holding the desiccant can be achieved simultaneously. In particular, in a small-sized GIS apparatus having a strict restriction in the size of the whole apparatus, this configuration contributes to downsizing of the whole apparatus.

CITATION LIST

Patent Document

Patent Document 1: Japanese Patent Application Laid-open No. 2004-271402

SUMMARY OF THE INVENTION

Problems to be Solved by the Invention

However, in the conventional technique as disclosed in Patent Document 1, the partial discharge sensor is constituted in the casing connected through the opening. The partial discharge sensor operates as an antenna that receives a high frequency radio wave generated by a partial discharge occurring in a closed space between a high-voltage wire and a ground. The intensity of the high frequency radio wave, which enters into the casing through the opening, sharply drops as it gets farther from the opening. In the configuration of the conventional technique, the outer and inner electrodes operate as the antenna as a whole, and thus, most of the antenna is configured to be placed at a deep part of the casing apart from the opening. As a result, there is a problem such that the high frequency radio wave to be received by the antenna is weaker, so that sensitivity as the partial discharge sensor is lower.

The present invention is made to solve the problem described above, and an object of the invention is to provide a partial discharge sensor that effectively detects the radio wave and has higher sensitivity.

Means for Solving the Problems

A partial discharge sensor according to the present invention includes: a first ground that includes a high-voltage wire, and constitutes a closed space in a manner to surround the high-voltage wire; a cylindrical branch pipe that is provided at a part of the first ground to protrude to an outer space; a first opening at an end of the branch pipe on a side to the closed space; a lid at an end of the branch pipe on a side opposite to the first opening; a first metal container disposed in a recess space constituted by the branch pipe and lid and having at least one hole through which gas can pass; a slit that is provided in a surface of the first metal container on a side of the first opening; a desiccant that is provided in the first metal container; an interval retainer that retains an interval between the slit and the desiccant; and a coaxial wire disposed inside the first metal container, wherein at one end of the coaxial wire, an outer conductor of the coaxial wire is connected to the first metal container at a portion near the center of the slit, and an inner conductor of the coaxial wire is connected to the first metal container on the opposite side across the slit with respect to a position where the outer conductor is connected, whereby the outer conductor and the inner conductor are operated as a slot antenna to detect a high frequency wave due to a partial discharge occurring in the closed space.

Effect of the Invention

The partial discharge sensor of the present invention can effectively detect the radio wave and enhance its sensitivity.

BEST MODE FOR CARRYING OUT THE INVENTION

Figure 1:
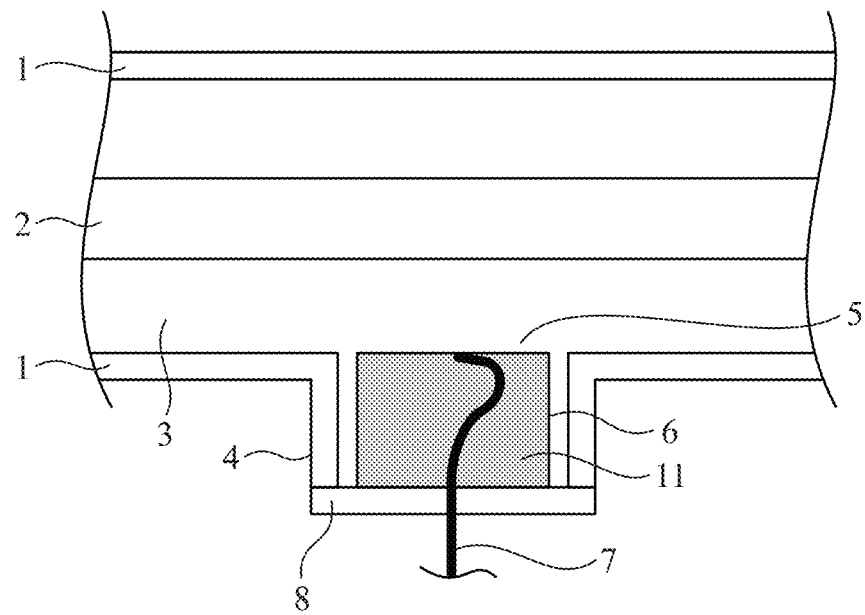
FIG. 1 is a schematic view of a partial discharge sensor according to Embodiment 1 of the present invention.

In the following, embodiments of the present invention are described in detail by referring to the drawings.

Embodiment 1

FIG. 1 is a schematic view of a partial discharge sensor according to Embodiment 1 of the present invention.

Figure 2:
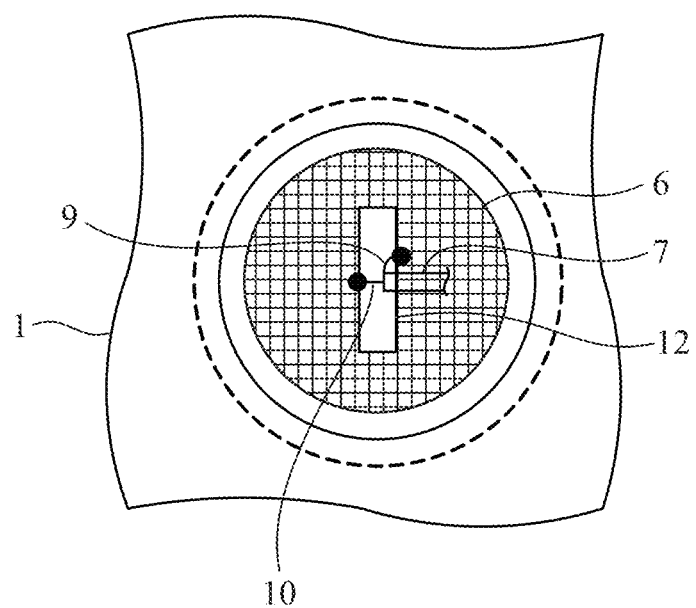
FIG. 2 is a diagram of the partial discharge sensor according to Embodiment 1 of the invention as viewed from the inner side of a GIS.

FIG. 2 is a diagram of the partial discharge sensor according to Embodiment 1 of the invention as viewed from the inner side of a GIS.

Figure 3:
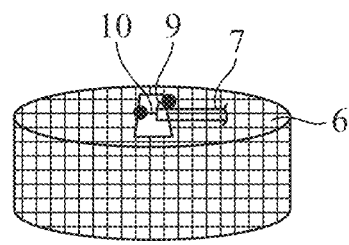
FIG. 3 is a perspective view of a first metal container of the partial discharge sensor according to Embodiment 1 of the invention.

FIG. 3 is a perspective view of a first metal container of the partial discharge sensor according to Embodiment 1 of the invention.

In FIG. 1, the partial discharge sensor includes a first ground 1, a high-voltage wire 2, a closed space 3, a branch pipe 4, a first opening 5, a first metal container 6, a coaxial wire 7, and a lid 8.

The first ground 1 has the high-voltage wire 2 inside, and constitutes the cylindrical closed space 3 in a manner to surround the high-voltage wire 2. In the GIS, the closed space 3 is sealed containing an insulating gas.

In addition, the branch pipe 4 having a cylindrical shape is constituted at part of the first ground 1. The branch pipe 4 has the first opening 5 at an end on the side to the closed space 3, while the other end thereof, that is, an end on the side opposite to the first opening 5 with respect to the closed space 3 of the branch pipe 4 is closed by the lid 8.

The first metal container 6 is disposed in a recess space constituted by the branch pipe 4 and the lid 8, and may have at least one hole through which gas can pass; thus, it is just required that the gas sealed in the closed space 3 can come and go therethrough.

In addition, the first metal container 6 is configured not to protrude into the closed space 3 with respect to the first ground 1. Therefore, no unnecessary high-voltage portion is produced in the closed space 3, so that the insulation performance of the GIS is not impaired.

Further, a desiccant 11 for drying the gas filled in the closed space 3 is held in the first metal container 6.

Furthermore, in this Embodiment 1, the first metal container 6 is formed of a meshed metal material. The meshed metal material is formed in a degree not hindering the come-and-go of the gas filled in the closed space 3 and with a sufficiently small coarseness in comparison with a wavelength of a high frequency radio wave to be detected. For example, because a frequency used for detecting a partial discharge is about 500 to 1,500 MHz by way of example, the coarse of the mesh may be several mm to several tens of mm.

Incidentally, in this Embodiment 1, the first metal container 6 is provided in a mesh shape; however, it may be provided with a plurality of holes formed with the sufficiently small coarseness in comparison with the wavelength of the high frequency to be detected.

The lid 8 is openable and closable, whereby the desiccant 11 can be replaced on a regular basis.

As shown in FIG. 2, a rectangular slit 12 is provided in a surface of the first metal container 6 on the side of the first opening 5.

In addition, the coaxial wire 7 is disposed inside the first metal container 6.

At one end of the coaxial wire 7, an outer conductor 9 of the coaxial wire 7 is connected to the first metal container 6 at a portion near the center of the slit 12, and an inner conductor 10 of the coaxial wire 7 is connected to the first metal container 6 on the opposite side across the slit 12 with respect to a position where the outer conductor 9 is connected.

Additionally, the slit 12 may have an elongated rectangular shape such that a length of two sides thereof to which the outer conductor 9 and the inner conductor 10 are connected is not longer than a diameter of the cylindrical branch pipe 4, in comparison with that of the other two sides, including a substantially rectangular shape, not a perfect rectangular shape.

As shown in FIG. 3, the first metal container 6 is formed in a cylinder type one.

Next, an operation principle will be described. Since the first metal container 6 is composed of the meshed metal material with a mesh that is sufficiently small in comparison with the wavelength, the first metal container 6 can be regarded as a uniform conductor in light of the high frequency. The rectangular slit 12 is provided in the surface of the conductor, and the inner conductor 10 and the outer conductor 9 of the coaxial wire 7 are connected to straddle the slit 12, whereby the inner conductor 10 and the outer conductor 9 is operated as a slot antenna to detect a high frequency wave due to a partial discharge occurring in the closed space 3.

The radio wave can be efficiently received in a case where the slit 12 has a length ranging a half wavelength to one wavelength of a frequency to be used. For example, the length is about 100 mm at the shortest and 600 mm at the longest when a frequency range of 500 to 1,500 MHz is taken into consideration.

The partial discharge occurs in the closed space 3, and generates the high frequency radio wave. A high frequency signal thereof is propagated into the branch pipe 4 through the first opening 5. A distribution of the high frequency signal in the branch pipe 4 is stronger at a portion closer to the first opening 5, and thus, the antenna that detects the high frequency radio wave can detect the radio wave more effectively at the portion closer to the first opening 5.

In the configuration shown in FIG. 1, the slot antenna can be constituted at a portion almost in contact with the first opening 5, and thus, a highly sensitive partial discharge sensor can be established. Furthermore, the desiccant 11 that is required for the GIS can be set in the first metal container 6; thus, a function as the partial discharge sensor and a function for holding the desiccant 11 can be achieved simultaneously. In particular, in a small-sized GIS apparatus having a strict restriction in the size of the whole apparatus, the above configuration contributes to downsizing of the whole apparatus.

As described above, according to this Embodiment 1, the partial discharge sensor that effectively detects the radio wave and has higher sensitivity can be provided. Furthermore, the whole GIS apparatus can be downsized.

Embodiment 2

Figure 4:
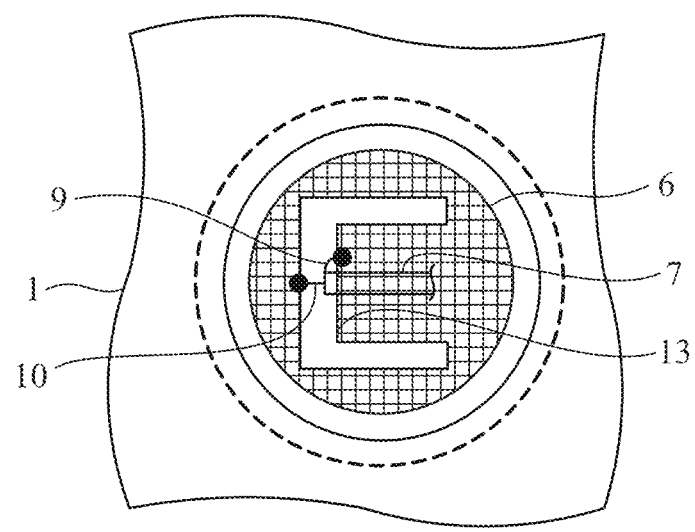
FIG. 4 is a diagram of a partial discharge sensor according to Embodiment 2 of the invention as viewed from the inner side of the GIS.

FIG. 4 is a diagram of a partial discharge sensor according to Embodiment 2 of the present invention as viewed from the inner side of a GIS.

Note that redundant descriptions for components that are the same as those described in Embodiment 1 will be omitted.

This Embodiment 2 is different from Embodiment 1 in that a U-shaped slit 13 is replaced with the rectangular slit 12 in Embodiment 1, as shown in FIG. 4.

Next, an operation principle will be described. In a structure described in Embodiment 1, the slot antenna is arranged in a linear form (see FIG. 2). However, the linear slot antenna has no sensitivity in a longitudinal direction of the slot, and thus cannot receive radio waves arriving from a vertical direction in the paper surface of FIG. 2.

On the other hand, a U-shaped slot antenna shown in FIG. 4 has sensitivity in all directions. Therefore, an advantage that the partial discharge can be detected regardless of a place where the partial discharge in the GIS occurs can be obtained, in addition to the advantageous effect of Embodiment 1.

As described above, according to this Embodiment 2, in addition to the higher sensitivity, the partial discharge sensor having the sensitivity in all the directions can be provided.

Embodiment 3

Figure 5:
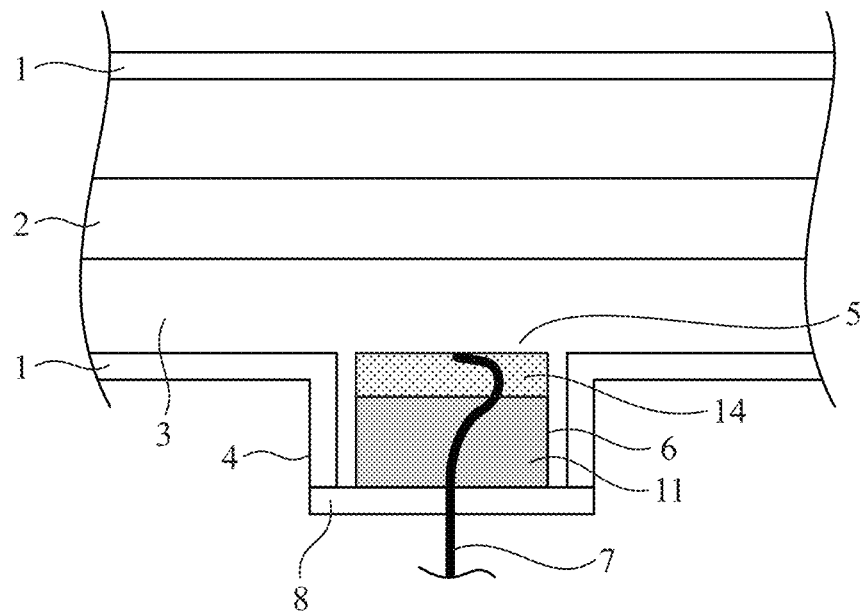
FIG. 5 is a schematic view of a partial discharge sensor according to Embodiment 3 of the invention.

FIG. 5 is a schematic view of a partial discharge sensor according to Embodiment 3 of the present invention.

Note that redundant descriptions for components that are the same as those described in Embodiments 1 and 2 will be omitted.

This Embodiment 3 is different from Embodiment 1 in that a nonconductive spacer 14 is provided as shown in FIG. 5.

The nonconductive spacer 14 is placed between the desiccant 11 and the slit 12 to prevent the desiccant 11 and the slit 12 from being closer to each other within a predetermined distance, and disposed in a state retaining a predetermined interval between the desiccant 11 and the slit 12.

The predetermined distance herein is a sufficient distance to prevent considerable degradation of the sensitivity of the partial discharge sensor. For example, a distance of more than about 20 mm may be provided between the desiccant 11 and the slit 12.

Next, an operation principle will be described. The desiccant 11 is a relative dielectric constant of about 7, and has a relatively high value. In addition, the desiccant changes over time by absorbing water inside the GIS.

In this connection, the performance of the antenna is more likely to degrade as a dielectric with a higher dielectric constant is closer to the antenna, and the degree of degradation is proportional to a closer distance therebetween.

In this Embodiment 3, the nonconductive spacer 14 is disposed between the desiccant 11 and the slit 12, and thus the desiccant 11 can be prevented from coming into close contact with the slot antenna. The considerable degradation of the sensitivity of the partial discharge sensor can be prevented as long as the distance between the desiccant 11 and the slit 12 is larger than about 20 mm, for example.

Additionally, a lower dielectric constant of the nonconductive spacer 14 is preferable, and thus a foaming material, a hollow resin structure, or the like is suitable therefor.

As described above, according to this Embodiment 3, in addition to the partial discharge sensor having the higher sensitivity, it becomes possible to reduce the sensitivity degradation of the partial discharge sensor.

Embodiment 4

Figure 6:
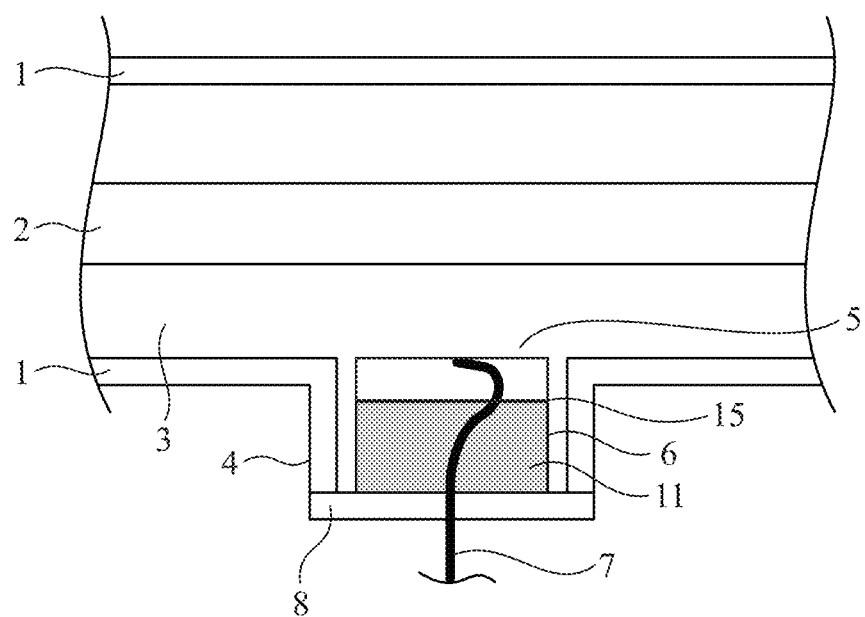
FIG. 6 is a schematic view of a partial discharge sensor according to Embodiment 4 of the invention.

FIG. 6 is a schematic view of a partial discharge sensor according to Embodiment 4.

Note that redundant descriptions for components that are the same as those described in Embodiments 1 to 3 will be omitted.

This Embodiment 4 is different from Embodiment 3 in that a nonconductive partition plate 15 is provided instead of the nonconductive spacer 14 as shown in FIG. 6.

The nonconductive partition plate 15 is placed between the desiccant 11 and the slit 12, and prevents the desiccant 11 and the slit 12 from being closer to each other within a predetermined distance, and disposed in a state retaining a predetermined interval between the desiccant 11 and the slit 12.

The predetermined distance herein is a sufficient distance to prevent considerable degradation of the sensitivity of the partial discharge sensor. For example, a distance of more than about 20 mm may be provided between the desiccant 11 and the slit 12.

Next, an operation principle will be described. The partition plate 15 holds the desiccant 11 to thus retain the predetermined distance between the desiccant 11 and the slit 12. Therefore, the desiccant 11 is prevented from coming into close contact with the slot antenna, which makes it possible to prevent the considerable degradation of the sensitivity of the partial discharge sensor.

Additionally, in this case, although it is assumed that the partition plate 15 is nonconductive, the same advantageous effect can be obtained even if the partition plate 15 is replaced with the one made of metal. However, when the partition plate 15 is made of metal, an unwanted resonance is generated in a gap between the partition plate 15 and the first metal container 6 to thus degrade the characteristic of the partial discharge sensor. In order to prevent this, it becomes necessary to prevent the unwanted resonance by conducting the partition plate 15 with the first metal container 6. In order to establish the conduction between the partition plate 15 and the first metal container 6, manufacturing difficulty thereof is deteriorated; however, the desiccant 11 can be covered from the slot antenna in light of a high frequency wave; thus, there is obtained an advantage such that considerable degradation of the sensitivity of the partial discharge sensor can be reduced up to a level such that the performance degradation due to the desiccant 11 can be ignored.

As described above, according to this Embodiment 3, in addition to the partial discharge sensor having the higher sensitivity, it becomes possible to reduce the sensitivity degradation of the partial discharge sensor.

Embodiment 5

This Embodiment 5 shows an aspect of a method of connecting the coaxial wire 7 and the slit 12 in FIG. 2, and shows one example of a specific method of connecting the coaxial wire 7 and the first metal container 6. Thus, an operation principle in this Embodiment 5 is the same as that in Embodiment 1.

Note that redundant descriptions for components that are the same as those described in Embodiments 1 to 4 will be omitted.

Figure 7:
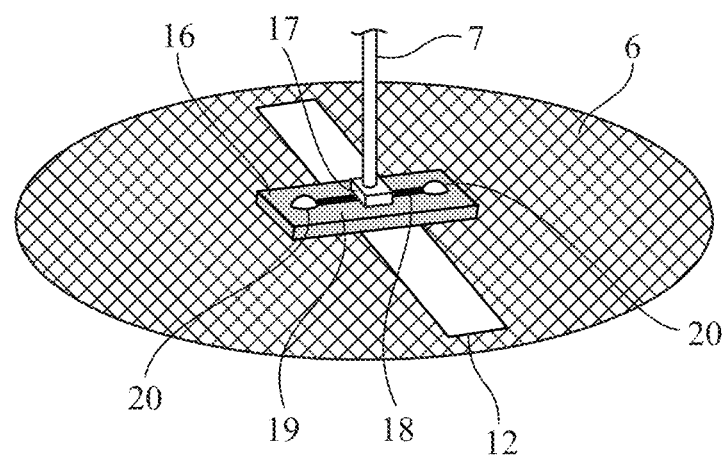
FIG. 7 is an enlarged schematic view of a connection portion between a coaxial wire and a slit in a partial discharge sensor according to Embodiment 5 of the invention.

FIG. 7 is an enlarged schematic view of a connection portion between the coaxial wire 7 and the slit 12 in a partial discharge sensor according to Embodiment 5 of the present invention.

In FIG. 7, the partial discharge sensor further includes a dielectric substrate 16, a receptacle 17, a signal wire 18, aground wire 19, and screws 20.

The dielectric substrate 16 is arranged to straddle the slit 12.

The receptacle 17 is mounted on the dielectric substrate 16. The inner conductor 10 and the outer conductor 9 of the coaxial wire 7 are respectively connected to the signal wire 18 and the ground wire 19 on the dielectric substrate 16 through the receptacle 17.

The signal wire 18 and the ground wire 19 extend to the first metal container 6 to straddle the slit 12. The signal wire 18 and the ground wire 19 are in pressure contact with the first metal container 6 with the screws 20, whereby the conduction is ensured.

As described above, according to this Embodiment 5, the partial discharge sensor that effectively detects the radio wave and has higher sensitivity can be provided.

Embodiment 6

Figure 8:
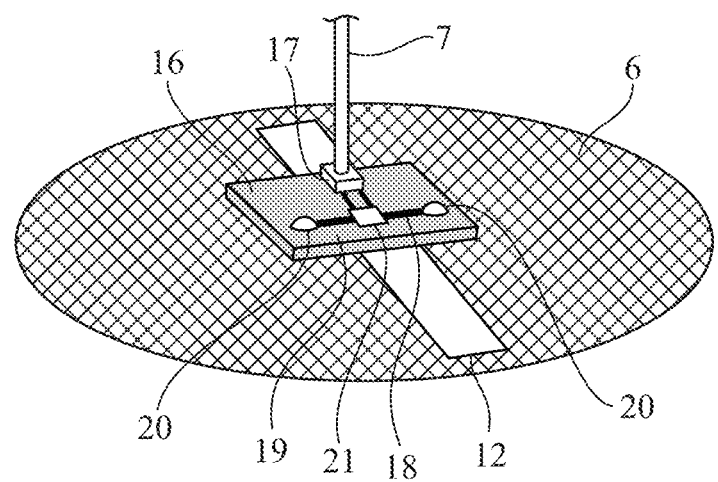
FIG. 8 is an enlarged schematic view of a connection portion between a coaxial wire and a slit in a partial discharge sensor according to Embodiment 6 of the invention.

FIG. 8 is an enlarged schematic view of a connection portion between the coaxial wire 7 and the slit 12 in a partial discharge sensor according to Embodiment 6 of the present invention.

Note that redundant descriptions for components that are the same as those described in Embodiments 1 to 5 will be omitted.

This Embodiment 6 is different from Embodiment 5 in that an impedance transformer 21 is provided as shown in FIG. 8.

The impedance transformer 21 is disposed between the receptacle 17 and the screws 20 to improve a matching state between an impedance of the slot antenna constituted of the slit 12 and an impedance involved in the coaxial wire 7.

Next, an operation principle will be described. Generally, the coaxial wire 7 has a characteristic impedance of 50Ω, and a maximum sensitivity is achieved in a case where the impedance of the slot antenna constituted of the slit 12 is 50Ω. However, the impedance of the slot antenna is generally higher than 50Ω, and thus the sensitivity is degraded due to mismatching of the impedances. In order to improve this, the impedance transformer 21 is inserted between the coaxial wire 7 and the screws 20.

As described above, according to this Embodiment 6, the partial discharge sensor having higher sensitivity can be provided by suppressing the degradation of the sensitivity due to the mismatching of the impedance of the slot antenna.

Incidentally, the embodiments can be freely combined, or any component of each embodiment can be modified or omitted within the scope of the invention of the present application.

INDUSTRIAL APPLICABILITY

The partial discharge sensor according to the present invention can effectively detect the radio wave to enhance its sensitivity, and thus can be applied to, for example, a partial discharge sensor that detects a high frequency occurring in a device in high power equipment such as GIS to thus detect a partial discharge phenomenon.

DESCRIPTION OF REFERENCE NUMERALS AND SIGNS

1: first ground
2: electrical wire
3: closed space
4: branch pipe
5: first opening
6: first metal container
7: coaxial wire
8: lid
9: outer conductor
10: inner conductor
11: desiccant
12, 13: slit
14: spacer
15: partition plate
16: dielectric substrate
17: receptacle
18: signal wire
19: ground wire
20: screw
21: impedance converter.

The invention claimed is:

1. A partial discharge sensor comprising:
a first ground that includes a high-voltage wire, and constitutes a closed space in a manner to surround the high-voltage wire;
a cylindrical branch pipe that is provided at a part of the first ground to protrude to an outer space;
a first opening at an end of the branch pipe on a side to the closed space;
a lid at an end of the branch pipe on a side opposite to the first opening;
a first metal container disposed in a recess space constituted by the branch pipe and the lid and having at least one hole through which gas can pass;
a slit that is provided in a surface of the first metal container on a side of the first opening;
a desiccant that is provided in the first metal container;
an interval retainer that retains an interval between the slit and the desiccant, such that the desiccant does not contact the slit; and
a coaxial wire disposed inside the first metal container, wherein at one end of the coaxial wire, an outer conductor of the coaxial wire is connected to the first metal container at a portion near the center of the slit, and an inner conductor of the coaxial wire is connected to the first metal container on the opposite side across the slit with respect to a position where the outer conductor is connected, whereby the outer conductor and the inner conductor are operated as a slot antenna to detect a high frequency wave due to a partial discharge occurring in the closed space.

2. The partial discharge sensor according to claim 1, wherein the first metal container is provided with a plurality of holes that is formed with a smaller coarse in comparison with a wavelength of the high frequency wave to be detected.

3. The partial discharge sensor according to claim 1, wherein the first metal container is formed of a meshed metal material.

4. The partial discharge sensor according to claim 1, wherein the lid separates the branch pipe and the outer space from each other, and is openable and closable.

5. The partial discharge sensor according to claim 1, wherein the slit is formed in a rectangular shape.

6. The partial discharge sensor according to claim 1, wherein the slit is formed in a U shape.

7. The partial discharge sensor according to claim 1, wherein the interval retainer is placed between the slit and the desiccant to retain an interval.

8. The partial discharge sensor according to claim 1, wherein the interval retainer is a partition plate to retain a space by separating between the slit and the desiccant.

9. The partial discharge sensor according to claim 8, wherein the partition plate is made of metal, and conduction is established between the partition plate and a first metal plate.

10. The partial discharge sensor according to claim 1, further comprising a dielectric substrate that is arranged to straddle the slit, wherein
the inner conductor and the outer conductor are respectively connected to a signal wire and a ground wire on the dielectric substrate.

11. The partial discharge sensor according to claim 10, wherein an impedance transformer is arranged on the dielectric substrate.

* * * * *